United States Patent
Kashino et al.

(10) Patent No.: US 6,217,651 B1
(45) Date of Patent: Apr. 17, 2001

(54) METHOD FOR CORRECTION OF THIN FILM GROWTH TEMPERATURE

(75) Inventors: Hisashi Kashino; Koichi Kanaya, both of Annaka (JP)

(73) Assignee: Shin-Etsu Handotai, Co., Ltd., Tokyo (JP)

(*) Notice: Subject to any disclaimer, the term of this patent is extended or adjusted under 35 U.S.C. 154(b) by 0 days.

(21) Appl. No.: 09/356,319

(22) Filed: Jul. 16, 1999

(30) Foreign Application Priority Data

Jul. 23, 1998 (JP) .................................................. 10-225347

(51) Int. Cl.⁷ .................................................. C30B 25/16
(52) U.S. Cl. .................................. 117/85; 117/82; 117/86; 117/90; 117/92
(58) Field of Search .................................. 117/82, 85, 86, 117/90, 92

(56) References Cited

U.S. PATENT DOCUMENTS 5,782,974 * 7/1998 Sorensen et al. .................... 117/82

FOREIGN PATENT DOCUMENTS

| | | | |
|---|---|---|---|
| 3-142948 | 6/1991 | (JP) | H01L/21/26 |
| 05291143 | 11/1993 | (JP) . | |
| 06168905 | 6/1994 | (JP) . | |
| 08097158 | 4/1996 | (JP) . | |

* cited by examiner

Primary Examiner—Robert Kunemund
(74) Attorney, Agent, or Firm—Snider & Associates; Ronald R. Snider

(57) ABSTRACT

In the process of thin film growth, actual temperature of a substrate is measured and corrected with low cost in short time. With first thin film growth equipment of which a difference between set temperature of a heating source and an actual temperature of the substrate (hereinafter, referred to as temperature characteristic) is known, a first calibration curve representing "thin film growth rate vs. substrate actual temperature" is prepared. Next, thin film growth is conducted at one set temperature T2 with use of second thin film growth equipment whose temperature characteristic is unknown, where a difference from a set temperature T1 reading from the first calibration curve in correspondence to a thin film growth rate G resulting from the thin film growth process is determined. This difference is added to a set temperature T3 in the diffusion controlled temperature region at which the thin film growth is actually performed, making it possible to achieve thin film growth at an accurate substrate surface temperature. The temperature characteristic of the first thin film growth equipment can be known based on a second calibration curve representing "sheet resistance vs. substrate actual temperature" prepared by using a test-use substrate by ion implantation.

10 Claims, 3 Drawing Sheets

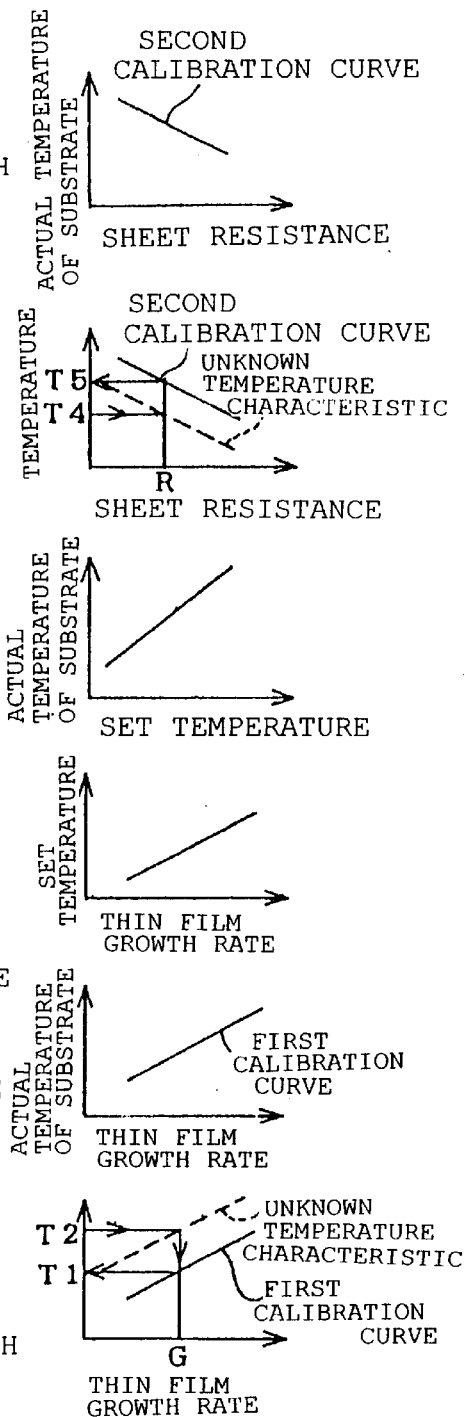

S1 — GRASP A "THIN FILM GROWTH RATE VS. SUBSTRATE ACTUAL TEMPERATURE" CORRELATION WITH TEST-USE SUBSTRATE BY ION IMPLANTATION (SECOND CALIBRATION CURVE)

S2 — DETERMINE A DIFFERENCE (T5 − T4) FROM SUBSTRATE ACTUAL TEMPERATURE T5 FROM SHEET RESISTANCE R AT ONE SET TEMPERATURE T4 WITH FIRST THIN FILM GROWTH EQUIPMENT WHOSE TEMPERATURE CHARACTERISTIC IS UNKNOWN.

S3 — GRASP TEMPERATURE CHARACTERISTIC OF FIRST THIN FILM GROWTH EQUIPMENT.

S4 — CONDUCT THIN FILM FORMATION FOR A SPECIFIED TIME IN KINETIC CONTROLLED TEMPERATURE REGION WITH FIRST THIN FILM GROWTH EQUIPMENT.

S5 — GRASP A "THIN FILM GROWTH RATE VS. SUBSTRATE ACTUAL TEMPERATURE" CORRELATION BY CONVERTING THE SET TEMPERATURE INTO A SUBSTRATE ACTUAL TEMPERATURE. (FIRST CALIBRATION CURVE)

S6 — DETERMINE A DIFFERENCE (T2 − T1) FROM SUBSTRATE ACTUAL TEMPERATURE T1 FROM A THIN FILM GROWTH RATE G AT ONE SET TEMPERATURE T2 WITH SECOND THIN FILM GROWTH EQUIPMENT WHOSE TEMPERATURE CHARACTERISTIC IS UNKNOWN.

S7 — ADD DIFFERENCE (T2 − T1) TO SET TEMPERATURE T3 IN DIFFUSION CONTROLLED TEMPERATURE REGION.

FIG. 1

METHOD FOR CORRECTION OF THIN FILM GROWTH TEMPERATURE

RELATED APPLICATION

This application claims the priority of Japanese Patent Application No. 10-225347 filed on July 23, 1998, which is incorporated herein by reference.

BACKGROUND OF THE INVENTION

This invention relates to a method for correction of thin film growth temperature and, more particularly, a technique for accurately controlling actual temperature of a semiconductor substrate during the process.

The technique for accurately measuring the actual temperature of a semiconductor substrate (hereinafter, referred to as actual temperature of substrate) during the process is important in various semiconductor processes. In particular, when thin film growth is performed with CVD (Chemical Vapor Deposition) equipment, high-precision temperature control is demanded because the actual temperature of the substrate largely affects such characteristics as the thickness of a deposited thin film, the uniformity and repeatability of resistivity, and the diffusion profile of a buried impurity diffusion layer.

As the method for measuring the semiconductor substrate temperature, there have conventionally been known those using thermocouples or optical pyrometers.

The thermocouple, in usual use, is buried in the center of the rear surface of a susceptor on which a semiconductor substrate is to be placed within semiconductor manufacturing equipment, in which case the semiconductor substrate temperature is determined based on the correlation between output of the heating source and the output voltage of the thermocouple. The thermocouple has been widely used by virtue of its large measurable range and good linearity of the correlation in measurement.

However, there arises a difference between temperature information derived from the thermocouple and the actual temperature of the substrate. This difference, indeed basically due to the fact that the target of measurement by the thermocouple is not the semiconductor substrate but the susceptor on which the semiconductor substrate is placed, but may arise within the same equipment unit, or between different equipment units, because of the setting of output of the heating source, the installation location of the susceptor or the replacement of parts. This would cause the actual process to progress at temperatures different from the set temperature.

On the other hand, the optical pyrometer, which is to determine the temperature of a heated semiconductor substrate by comparing the brightness of radiated light from the heated semiconductor substrate with the brightness of a standard lamp, is suitable for measurement in high temperature regions over 800° C. However, with the optical pyrometer used, because the brightness is measured beyond the wall of a reactor made of quartz in the CVD equipment, the quantity of radiated light absorbed by the reactor wall does not hold constant due to the degree of contamination or thickness of the reactor wall. This makes it difficult to accurately measure the actual temperature of the substrate, disadvantageously.

As a means for solving these problems, there has been proposed a substrate-surface temperature measuring method using ion-implanted wafers in Japanese Patent Laid-Open Publication HEI 3-142948.

In this method, first, a plurality of diffusion wafers each having at the surface an impurity implantation layer of a specified concentration formed by ion implantation are prepared. These diffusion wafers are placed in a heat treatment furnace whose temperature characteristics are known, and subjected to heat treatment for a specified time under a plurality of different temperature conditions, so that ion-implanted impurities are diffused. Subsequently, by measuring sheet resistance of each diffusion wafer, a calibration curve representing the correlation between sheet resistances and known temperatures is prepared. Next, the diffusion wafers are placed in a reactor, which is the measurement target, and subjected to heat treatment at a thin film growth temperature for the same time duration as the heat treatment time in the preparation of the calibration curve. After this, sheet resistance of the diffusion wafers is measured by, for example, the four-point probe method. By determining the temperature corresponding to this sheet resistance value from the foregoing calibration curve, the actual temperature of the substrate placed in the measurement-target reactor can be known accurately.

However, in the technique disclosed in Japanese Patent Laid-Open Publication HEI 3-142948, at least one diffusion wafer made by ion implantation is needed each time the actual temperature of the substrate is measured. This diffusion wafer is unfortunately time-consuming and expensive, and moreover poorly available for 200 mm or more large-diameter types. Still, this diffusion wafer is made only for the measurement, and useless otherwise. Besides, even only the heat treatment for the measurement of the actual temperature of the substrate requires about one hour, to which the time required for the cooling of the diffusion wafer and the measurement of sheet resistance is added, so that at least two hours or more are spent for onetime measurement.

As shown above, the method using diffusion wafers, although superior in precision, may at a large possibility impair the economy and productivity when usually repeated.

Therefore, an object of the invention is to provide a method capable of solving these problems, and measuring and correcting the actual temperature of the semiconductor substrate at low cost in short time.

SUMMARY OF THE INVENTION

The method for correction of thin film growth temperature according to the invention, which is proposed to achieve the above object, comprises adding a difference between a set temperature of a heating source and an actual temperature of a substrate determined from thin film growth rate in a kinetic controlled temperature (controlled by reaction rate) region, to the set temperature of the heating source for thin film growth in a diffusion controlled (controlled by feed rate) temperature region.

In order to determine the difference between the set temperature of the heating source and the actual temperature of the substrate, first, with first thin film growth equipment of which such a difference has already been known, a thin film is grown on the substrate for a specified time at a plurality of set temperatures within the kinetic controlled temperature region, by which a first calibration curve representing the relationship between thin film growth rate and actual temperature of the substrate is prepared. Next, with second thin film growth equipment of which such a difference has not been known, a thin film growth rate G resulting when the thin film is grown on the substrate at one set temperature T1 within the kinetic controlled temperature region is determined. Next, an actual temperature T2 of the substrate corresponding to the thin film growth rate G is determined based on the previously prepared first calibration curve. A value obtained by subtracting the set temperature T1 from the substrate actual temperature T2 (T2−T1) is the difference.

Therefore, adding this difference (T2−T1) to one set temperature T3 within the diffusion controlled temperature region for a thin film growth process using the second thin film growth equipment makes it possible to achieve the correction of thin film growth temperature.

For this purpose, it is necessary to previously clarify the difference between the set temperature of the heating source in the first thin film growth equipment and the actual temperature of the substrate. In order to meet this necessity, first, a test-use substrate in which impurities of known concentration have been ion-implanted is loaded into a heat treatment device of which the difference between the set temperature of the heating source and the actual temperature of the substrate is known, and heat treatment is conducted for a specified time at a plurality of set temperatures within the kinetic controlled temperature region and/or the diffusion controlled temperature region, by which a second calibration curve representing the relationship between sheet resistance of the test-use substrate and the actual temperature of the substrate is prepared. Next, the test-use substrate in which impurities of known concentration have been ion-implanted is loaded into first thin film growth equipment, a sheet resistance R resulting when the heat treatment is conducted at one set temperature T4 of the heating source is determined and then a substrate actual temperature T5 corresponding to the resulting sheet resistance R is determined from the second calibration curve. A difference between these set temperature T4 and substrate actual temperature T5 (T5−T4) is regarded as a universal temperature error of the first thin film growth equipment.

BRIEF DESCRIPTION OF THE DRAWINGS

FIG. 1 is a flow diagram showing the procedure for the method for correction of thin film growth temperature according to the invention;

DETAILED DESCRIPTION OF THE PREFERRED EMBODIMENTS

Figure 2:
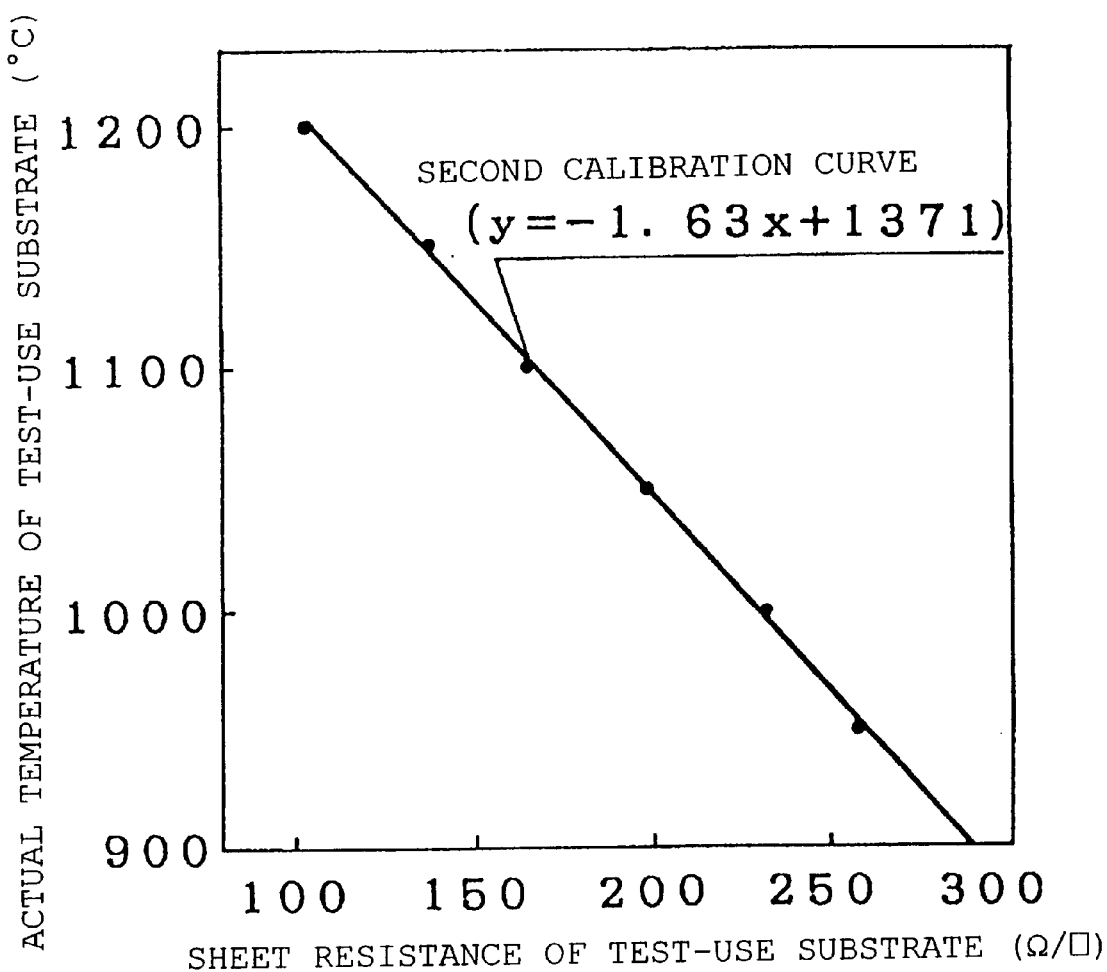
FIG. 2 is a graph of a second calibration curve representing a correlation between sheet resistance of a test-use substrate by ion implantation and the actual temperature of the test-use substrate.

In the invention, with attention paid to the fact that there is a correlation between thin film growth rate and temperature, with regard to thin film growth equipment of which temperature characteristic, i.e., a difference between the set temperature of the heating source and the actual temperature of the substrate is unknown, the difference is grasped based on the first calibration curve representing "thin film growth rate vs. substrate actual temperature" prepared in the kinetic controlled temperature region, by which temperature correction is achieved by adding the difference to the set temperature even when the actual thin film growth is performed in the diffusion controlled temperature region with the above thin film growth equipment.

According to the invention, semiconductor substrates actually used in the manufacture of thin films can be used for measurement, thus eliminating the need of consuming one sheet of diffusion wafers that are expensive and useless otherwise for each time of measurement, as would be involve in the prior art.

In addition, with respect to the first thin film growth equipment for preparing the first calibration curve representing "thin film growth rate vs. substrate actual temperature", there is a need of grasping the difference between the set temperature of the heating source and the actual temperature of the substrate with the use of a diffusion wafer by ion implantation as a test-use substrate, as would be done conventionally, for the purpose of grasping the temperature characteristic. However, once these temperature characteristic is grasped, the diffusion wafer is no longer required afterwards, so that cost and time required for measurement can be saved to a great extent.

The term "kinetic controlled temperature region in the thin film growth" refers to a temperature region in which reaction of raw material gas and its succeeding thin film growth do not progress at a sufficient rate due to low temperature of the semiconductor substrate notwithstanding that a sufficient amount of raw material gas is supplied. The thin film growth rate in this temperature region depends principally on the actual temperature of the substrate, and less affected by the gas flow within the reactor. Therefore, while the thin film growth rate largely varies in proportion to temperature variations of the semiconductor substrate, the thin film growth rate at the same substrate temperature is less affected by any differences among individual equipment units or differences among installation conditions of parts, so that a good linearity holds between thin film growth rate and substrate actual temperature. This is the reason why the first calibration curve representing "thin film growth rate vs. substrate actual temperature" is prepared in the kinetic controlled temperature region in the invention.

In the case of a process in which a silicon epitaxial film is formed on a silicon single crystal substrate with a silane-based gas, the kinetic controlled temperature region is a region not less than 900° C. and less than 1050° C.

The diffusion controlled temperature region, on the other hand, is a temperature region in which the thin film growth rate varies in proportion to the feed amount of the raw material gas because of a sufficiently high temperature of the semiconductor substrate and a fast progress of the reaction of the raw material gas. The thin film growth rate in this temperature region is more affected by the gas flow in the reactor, involving larger effects of differences among the equipment units and among installation conditions of parts. However, for the point of view of the quality and productivity of yielded thin films, thin film growth is carried out in this temperature region in the fields of industrial production.

In the case of a process in which a silicon epitaxial film is formed on a silicon single crystal substrate with a silane-based gas, the diffusion controlled temperature region is a region not less than 1050° C.

For preparation of a second calibration curve representing "sheet resistance vs. substrate actual temperature" with the use of a diffusion wafer by ion implantation as a test-use substrate, it is acceptable that a plurality of set temperatures are provided only in the kinetic controlled temperature region, or only in the diffusion controlled temperature region, or in both these regions. In addition, it is in the case where the set temperatures are provided in both regions that the highest accuracy can be obtained.

On the precondition of temperature correction for silicon epitaxial growth, the diffusion wafer to be used is one in which boron (B) or phosphorus (P) have been ion-implanted as impurities on an order of about $10^{14}/cm^2$ in a silicon single crystal substrate. Preferably, after this, the ion implantation side of the diffusion wafer is covered with silicon oxide. With this silicon oxide present, because the implanted impurities are all diffused into the inside of the diffusion wafer, temperature increase and diffusion depth are enlarged so that the sheet resistance lowers.

The procedure for actual temperature correction in the invention is shown in FIG. 1.

First, at step S1, a test-use substrate by ion implantation and heat treatment equipment whose temperature characteristic is known are used and subjected to heat treatment for a specified time at a plurality of set temperatures, by a second calibration curve representing a sheet resistance vs. substrate actual temperature correlation is prepared.

Next at step S2, first thin film growth equipment whose temperature characteristic is unknown is used, and a difference (T5−T4) from a actual temperature T5 of the substrate is determined from the sheet resistance R at the set temperature T4 of one heating source is determined.

Next at step S3, temperature characteristic of the first thin film growth equipment is grasped. The correlation between set temperature and substrate actual temperature obtained in this step is a result of adding the above difference (T5−T4) to a line y=x. In the chart, (T5−T4) is assumed to be a positive value but may naturally be a negative one.

In this way, with the use of the first thin film growth equipment whose temperature characteristic has been clarified, thin film growth for a specified time is conducted at a plurality of set temperatures within the kinetic controlled temperature region at step S4, by which a line showing the correlation between growth rate and heating source is obtained.

At succeeding step S5, the set temperature is changed to the substrate actual temperature. This change can be achieved only by moving the y-intercept of the line to an extent of (T5−T4).

Subsequently at step S6, with the use of the second thin film growth equipment whose temperature characteristic is unknown, a difference (T2−T1) from the substrate actual temperature T1 is determined from the thin film growth rate G at one set temperature T2 within the kinetic controlled temperature region. In the chart, (T2−T1) is assumed to be a positive value, but may naturally be a negative value.

Finally at step S7, the above difference (T2−T1) is added to the set temperature T3 of the heating source within the diffusion controlled temperature region. In this way, a new set temperature is determined to be T3+(T2−T1), by which the substrate actual temperature is adjusted to T3. Thus, it has been enabled to carry out an accurate thin film growth.

A concrete example of the invention is described below.

In this case, temperature correction is conducted with an assumption for a thin film growth process in which a p⁻-type silicon epitaxial layer having a 10 Ω·cm resistivity is grown in vapor phase on a p⁺-type silicon substrate having a 200 mm diameter, a 0.01 Ω·cm–0.02 Ω·cm resistivity and a (100)-oriented main surface.

First, as test-use substrates by ion implantation, were prepared a plurality of sheets of substrates in each of which phosphorus, an n-type impurity, had been ion-implanted into a p⁻-type silicon single crystal substrate having a 200 mm diameter, a 10 Ω·cm resistivity and a (100)-oriented main surface. This ion implantation was performed at an ion acceleration energy of 50 keV, a dose amount of $3.0 \times 10^{14}/cm^2$, as an example. Also, a 0.5 μm thick silicon oxide was formed by CVD process on the main surface of the ion-implanted test-use substrate.

Next, the test-use substrates were set one by one in a heat diffusion furnace whose temperature characteristic was known, and subjected to one-hour heat treatment at temperatures of 950° C., 1000° C., 1050° C., 1100° C., 1100° C., 1150° C. and 1200° C. This temperature region of 950° C.–1200° C. covers the kinetic controlled temperature region to the diffusion controlled temperature region in the silicon epitaxial growth. A resultant calibration curve (second calibration curve) is shown in FIG. 2.

Figure 3:
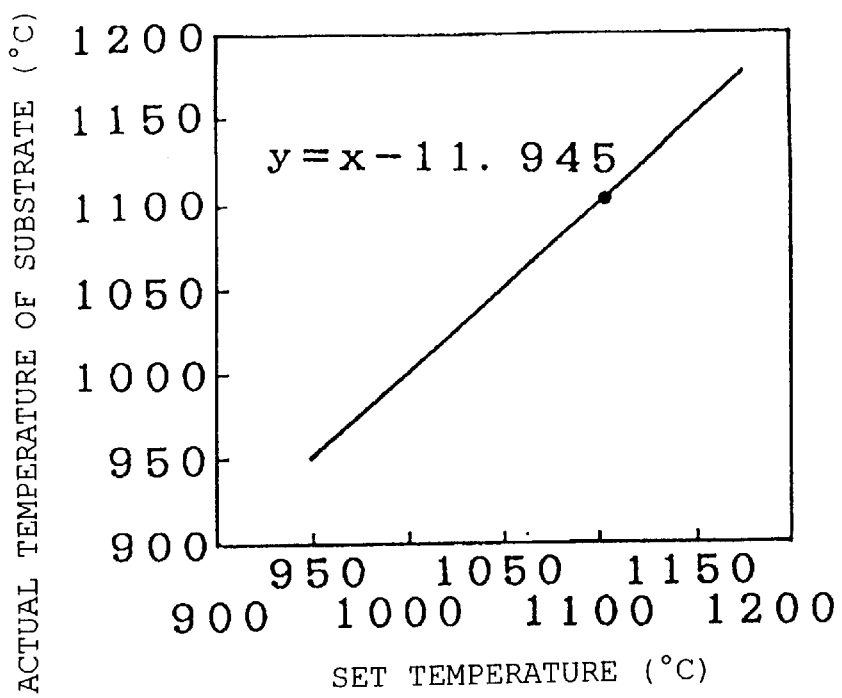
FIG. 3 is a graph showing a correlation between set temperature of a heating source and actual temperature of the test-use substrate.

Next, one sheet of the foregoing test-use substrates was set on a susceptor in a first single-wafer type epitaxial reactor whose temperature characteristic was unknown with infrared lamp heating taken as a heating source, and then one-hour heat treatment was conducted with the set temperature of the heating source set at 1110° C., by which a sheet resistance at the set temperature was determined and compared with the substrate actual temperature reading from FIG. 2. Prepared based on the resulting difference, a graph showing the correlation between the set temperature of the heating source and the actual temperature of the test-use substrate is given as FIG. 3.

Next, with the first single-wafer type epitaxial reactor used at several set temperatures in the kinetic controlled temperature region of 900° C.–1000° C., a silicon epitaxial layer was grown in vapor phase.

Vapor phase growth conditions were as follows, as an example:

SiHCl₃ flow rate (diluted to 20% with H₂): 20 liters/min.
H₂ flow rate on the front surface side of substrate: 50 liters/min.
H₂ flow rate on the rear side of susceptor: 5 liters/min.
Growth time: 2 min.

Thin film growth rate (μm/min.) was calculated from the thickness of the silicon epitaxial layers obtained at the individual set temperatures, and a thin film growth rate vs. heating source set temperature correlational diagram was prepared.

Figure 4:
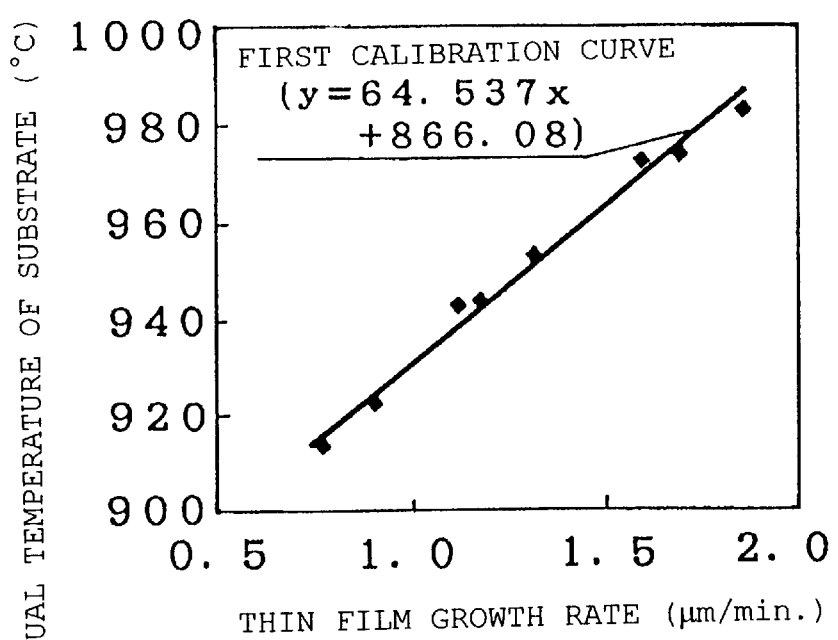
FIG. 4 is a graph of a first calibration curve representing a correlation between thin film growth rate and actual temperature of the substrate.

Further, the set temperatures were converted into substrate actual temperatures, and a first calibration curve as shown in FIG. 4 was obtained.

With the first calibration curve used, temperature correction for the second single-wafer type epitaxial growth equipment whose temperature characteristic was unknown was performed. It is noted that this single-wafer type epitaxial equipment is designed to monitor thin film growth temperature by using a thermocouple buried in a rear-surface center of the susceptor. The reason why a thermocouple was used for temperature monitoring in this case is that this measuring means is capable of outputting temperature information while maintaining a good linear relation over a wide temperature range with respect to the output of the heating source. In the invention, since a difference between the set temperature of the heating source and the actual temperature of the substrate obtained based on the first calibration curve prepared in the kinetic controlled temperature region is used, as it is, for temperature correction in the diffusion controlled temperature region, a linearity of response can be determined over a wide temperature range from the kinetic controlled temperature region to the diffusion controlled temperature region.

First, with a 950° C. set temperature of the heating source in a second single-wafer type epitaxial growth equipment, silicon epitaxial growth was conducted under the above conditions. From the thickness of the resulting silicon epitaxial layer and the film formation time, thin film growth rate turned out to be 1.18 μm/min.

However, according to the first calibration curve as shown in FIG. 4, the substrate actual temperature that achieves a thin film growth rate of 1.18 μm/min. was 942.2° C. That is, it proved that only a temperature which was 7.8° C. lower than the set temperature was achieved actually.

With a desire for a substrate actual temperature of 1110° C. in actual industrial production, the set temperature of the heating source in this equipment was raised by 7.8° C. so as to be 1117.8° C. As a result, the actual temperature of the substrate was able to be controlled just to 1110° C., making it possible to achieve silicon epitaxial growth with good precision.

Concrete examples of the invention have been given as shown above, but the invention is not limited to these examples at all. For example, the above examples have been described on a temperature correction method in which a silicon epitaxial layer is grown. However, when the kind of film to be grown is changed, it is appropriate that a calibration curve representing "thin film growth rate vs. substrate actual temperature" in a kinetic controlled temperature region that depends on the film formation mechanism of the relevant film is prepared similarly, and that a difference between the set temperature of the heating source and the actual temperature of the substrate is added to the set temperature in the diffusion controlled temperature region.

As apparent from the foregoing description, in the invention, since temperature correction is conducted based on the calibration curve representing the correlation between thin film growth rate and substrate actual temperature, temperature measurement can be achieved by using a substrate that is actually used for the production. For preparation of this calibration curve, in order to make known the temperature characteristic of the thin film growth equipment to be used, test-use substrates by ion implantation, which have conventionally been in common use, are preferably used in terms of precision. However, because the test-use substrates by ion implantation are no longer required once the temperature characteristic has been known, cost and time required for temperature measurement can be reduced to a large extent.

In the invention, a temperature difference unique to the equipment, which has been obtained in the kinetic controlled temperature region, is added to the set temperature in the diffusion controlled temperature region for the actual thin film growth process, where monitoring the thin film growth temperature with a thermocouple allows the temperature setting to be achieved accurately.

The invention enables a precision control of the substrate actual temperature in the silicon epitaxial growth, offering a significantly large industrial value.

What is claimed is:

1. A method for correction of thin film growth temperature, comprising adding a difference between a set temperature of a heating source and an actual temperature of a substrate determined from thin film growth rate in a kinetic controlled temperature region, to the set temperature of the heating source for thin film growth in a diffusion controlled temperature region.

2. A method for correction of thin film growth temperature, comprising adding a difference between a set temperature of a heating source and an actual temperature of a substrate determined from thin film growth rate in a kinetic controlled temperature region, to the set temperature of the heating source for thin film growth in a diffusion controlled temperature region, and wherein the difference between the set temperature of the heating source and the actual temperature of the substrate is determined through:

a step for preparing a first calibration curve representing a relationship between thin film growth rate and substrate actual temperature by making a thin film grown on the substrate for a specified time at a plurality of set temperatures in the kinetic controlled temperature region with use of first thin film growth equipment whose difference between the set temperature of the heating source and the actual temperature of the substrate is known;

a step for determining a thin film growth rate G resulting when a thin film is grown on the substrate at one set temperature T1 in the kinetic controlled temperature region by using second thin film growth equipment whose difference between the set temperature of the heating source and the actual temperature of the substrate is unknown; and a step for determining an actual temperature T2 of the substrate corresponding to the thin film growth rate G based on the first calibration curve, whereby the difference is calculated as (T2−T1), and wherein the resulting difference (T2−T1) is added to one set temperature T3 in the diffusion controlled temperature region in executing thin film growth using a second thin film growth equipment.

3. The method for correction of thin film growth temperature according to claim 2, wherein the difference between the set temperature of the heating source and the actual temperature of the substrate is determined through:

a step for preparing a second calibration curve representing a relationship between sheet resistance of the test-use substrate and the actual temperature of the substrate, by loading a test-use substrate in which impurities of known concentration have been ion-implanted into a heat treatment device of which the difference between the set temperature of the heating source and the actual temperature of the substrate is known, and by conducting heat treatment for a specified time at a plurality of set temperatures in the kinetic controlled temperature region and/or the diffusion controlled temperature region;

a step for determining a sheet resistance R resulting when the heat treatment is conducted at one set temperature T4, by using the first thin film growth equipment, with respect to a test-use substrate in which impurities of known concentration have been ion-implanted; and a step for determining a substrate actual temperature T5 corresponding to the sheet resistance R based on the second calibration curve, and wherein the difference is calculated as a difference between the set temperature T4 and the substrate actual temperature T5 (T5−T4).

4. The method for correction of thin film growth temperature according to claim 2, wherein monitoring of thin film growth temperature in the second thin film growth equipment is performed by using a thermocouple.

5. The method for correction of thin film growth temperature according to claim 1, wherein the substrate is a silicon single crystal substrate, and the thin film to be grown thereon is a silicon epitaxial layer.

6. The method for correction of thin film growth temperature according to claim 2, wherein the substrate is a silicon single crystal substrate, and the thin film to be grown thereon is a silicon epitaxial layer.

7. The method for correction of thin film growth temperature according to claim 3, wherein the substrate is a silicon single crystal substrate, and the thin film to be grown thereon is a silicon epitaxial layer.

8. The method for correction of thin film growth temperature according to claim 1, wherein the kinetic controlled temperature region is not less than 900° C. and less than 1050° C., and the diffusion controlled temperature region is not less than 1050° C.

9. The method for correction of thin film growth temperature according to claim 2, wherein the kinetic controlled temperature region is not less than 900° C. and less than 1050° C., and the diffusion controlled temperature region is not less than 1050° C.

10. The method for correction of thin film growth temperature according to claim 3, wherein the kinetic controlled temperature region is not less than 900° C. and less than 1050° C., and the diffusion controlled temperature region is not less than 1050° C.

* * * * *